United States Patent
Hormis et al.

(10) Patent No.: US 10,728,015 B1
(45) Date of Patent: Jul. 28, 2020

(54) ADAPTIVE PHASE-LOCKED LOOP BANDWIDTH CONTROL

(71) Applicant: QUALCOMM Incorporated, San Diego, CA (US)

(72) Inventors: Raju Hormis, New York, NY (US); Pavel Monat, San Diego, CA (US); Robert Douglas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/433,753

(22) Filed: Jun. 6, 2019

(51) Int. Cl.
*H04L 7/033* (2006.01)

(52) U.S. Cl.
CPC .................... *H04L 7/033* (2013.01)

(58) Field of Classification Search
CPC ..... H04L 2027/0044; H04L 2027/0071; H04L 2027/0046; H04L 2027/0053; H04L 2027/0069; H04L 2027/0081
See application file for complete search history.

(56) References Cited

U.S. PATENT DOCUMENTS

| 8,610,473 | B2 | 12/2013 | Abbasi et al. | |
|---|---|---|---|---|
| 9,344,100 | B2 | 5/2016 | Liu et al. | |
| 9,590,645 | B2 | 3/2017 | Jackson et al. | |
| 9,985,775 | B2 | 5/2018 | Patapoutian et al. | |
| 10,075,285 | B2 | 6/2018 | Cho et al. | |
| 2003/0053564 | A1* | 3/2003 | Kim | H04L 25/03159 375/326 |
| 2005/0147076 | A1* | 7/2005 | Sadowsky | H04B 7/0408 370/343 |
| 2012/0106611 | A1* | 5/2012 | Kim | H04L 27/2657 375/226 |
| 2016/0374035 | A1* | 12/2016 | Wang | H04W 56/0005 |
| 2017/0026049 | A1* | 1/2017 | Sundstrom | H03B 5/32 |

* cited by examiner

*Primary Examiner* — Kevin Kim
(74) *Attorney, Agent, or Firm* — Qualcomm IP Dept.; James Hunt Yancey, Jr.

(57) ABSTRACT

Various aspects of the present disclosure generally relate to wireless communication. In some aspects, a user equipment (UE) may determine at least one of an orthogonal frequency division multiplexing (OFDM) parameter associated with the UE or a modem function associated with a modem of the UE. The UE may control a loop bandwidth of a phase-locked loop (PLL), used to generate a tunable radio frequency (RF) carrier frequency used by the UE to communicate synchronously with a base station, based at least in part on at least one of the OFDM parameter or the modem function. Numerous other aspects are provided.

30 Claims, 6 Drawing Sheets

ADAPTIVE PHASE-LOCKED LOOP BANDWIDTH CONTROL

TECHNICAL FIELD

Aspects of the technology described below generally relate to wireless communication and to techniques and apparatuses for adaptive phase-locked loop bandwidth control. Some techniques and apparatuses described herein enable and provide wireless communication devices and systems configured for correcting errors associated with phase noise and inter-carrier interference.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. A BS may be referred to as a Node B, a gNB, an access point (AP), a radio head, a transmit receive point (TRP), a New Radio (NR) BS, a 5G Node B, and/or the like.

Multiple access technologies have been adopted in various telecommunication standards. Wireless communication standards provide common protocols to enable different devices (e.g., user equipment) to communicate on a municipal, national, regional, and even global level. New Radio (NR), which may also be referred to as 5G, is a set of enhancements to the LTE mobile standard promulgated by the Third Generation Partnership Project (3GPP). As demand for mobile broadband access continues to increase, there exists a need for further improvements in LTE and NR technologies. These improvements can apply to other multiple access technologies and the telecommunication standards that employ these technologies.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. The purpose of the summary is to present some concepts of one or more aspects of the disclosure in summary form as a prelude to the more detailed description that is presented later.

A phase-locked loop of a user equipment (UE) generates a tunable radio frequency (RF) carrier frequency used for down-conversion and demodulation of a signal received from a base station, and in the process may affect the phase noise, which reduces the accuracy of demodulation. Phase noise may contribute to both constant phase error (CPE) and inter-carrier interference (ICI), both of which reduce the accuracy of demodulation. However, CPE and ICI have different effects on demodulation. In some conditions (e.g., for some OFDM parameters and/or modem functions), CPE may have a bigger impact on the accuracy of demodulation than ICI. In other conditions, ICI may have a bigger impact on the accuracy of demodulation than CPE. Some techniques and apparatuses described herein improve demodulation performance by accounting for these conditions when mitigating CPE and ICI.

In some aspects, a method of wireless communication, performed by a UE, may include determining at least one of an orthogonal frequency division multiplexing (OFDM) parameter associated with the UE or a modem function associated with a modem of the UE; and controlling a loop bandwidth of a phase-locked loop (PLL), used to generate a tunable radio frequency (RF) carrier frequency used by the UE to communicate synchronously with a base station, based at least in part on at least one of the OFDM parameter or the modem function.

In some aspects, a UE for wireless communication may include memory and one or more processors operatively coupled to the memory. The memory and the one or more processors may be configured to determine at least one of an OFDM parameter associated with the UE or a modem function associated with a modem of the UE; and control a loop bandwidth of a PLL, used to generate a tunable RF carrier frequency used by the UE to communicate synchronously with a base station, based at least in part on at least one of the OFDM parameter or the modem function.

In some aspects, a non-transitory computer-readable medium may store one or more instructions for wireless communication. The one or more instructions, when executed by one or more processors of a UE, may cause the one or more processors to: determine at least one of an OFDM parameter associated with the UE or a modem function associated with a modem of the UE; and control a loop bandwidth of a PLL, used to generate a tunable RF carrier frequency used by the UE to communicate synchronously with a base station, based at least in part on at least one of the OFDM parameter or the modem function.

In some aspects, an apparatus for wireless communication may include means for determining at least one of an OFDM parameter associated with the apparatus or a modem function associated with a modem of the apparatus; and means for controlling a loop bandwidth of a PLL, used to generate a tunable RF carrier frequency used by the apparatus to communicate synchronously with a base station, based at least in part on at least one of the OFDM parameter or the modem function.

Aspects generally include a method, apparatus, system, computer program product, non-transitory computer-readable medium, user equipment, base station, wireless communication device, and/or processing system as substantially described herein with reference to and as illustrated by the accompanying drawings and specification. Further aspects include features enabling and providing adaptive phase-lock loop parameters based on a variety of factors, including which physical channel is received (e.g., synchronization indicators/information, uplink data, downlink data), or numerology used during wireless communication operations. Still yet additional aspects include adaptive PLL parameters (e.g., loop bandwidth) to a particular subcarrier spacing, MCS, PTRS density, and/or DL/UL channel. Adaptive PLL features can enable wireless communication devices (e.g., UEs, BSs, wireless modems, and/or the like) to achieve a higher data rate by reducing PTRS overhead, and can enable efficient energy consumption (e.g., when a smaller loop filter bandwidth is sufficient).

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description is provided herein, with some aspects of the disclosure being illustrated in the appended drawings. However, the appended drawings illustrate only some aspects of this disclosure and are therefore not to be considered limiting of the scope of the disclosure. The same reference numbers in different drawings may identify the same or similar elements.

DETAILED DESCRIPTION

Figure 1:
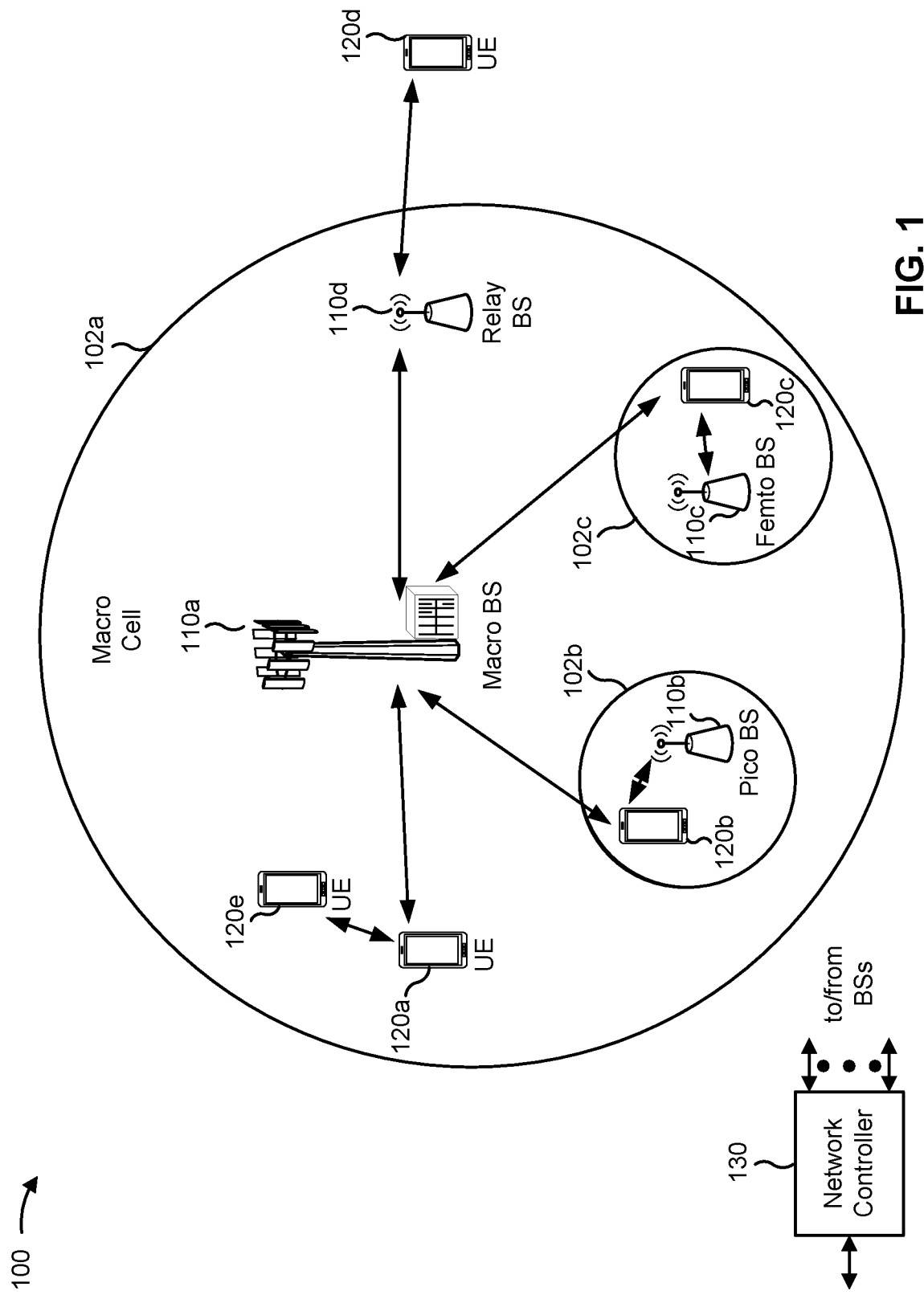
FIG. 1 is a block diagram illustrating an example of a wireless communication network, in accordance with various aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements" or "features"). These elements may be implemented using hardware, software, or combinations thereof. Whether such elements are implemented as hardware or software depends upon the particular application and design constraints imposed on the overall system.

While some aspects may be described herein using terminology commonly associated with 3G and/or 4G wireless technologies, aspects of the present disclosure can be applied in other generation-based communication systems, such as 5G and later, including NR technologies.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and/or other non-module-component based devices (e.g., end-user devices, vehicles, communication devices, computing devices, industrial equipment, retail/purchasing devices, medical devices, AI-enabled devices, and/or the like). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including one or more antennas, RF-chains, power amplifiers, modulators, buffers, processors, interleavers, adders/summers, and/or the like). It is intended that innovations described herein may be practiced in a wide variety of devices, chip-level components, systems, distributed arrangements, end-user devices, etc. of varying sizes, shapes, and constitution.

FIG. 1 is a diagram illustrating a wireless network 100 in which aspects of the present disclosure may be practiced. The wireless network 100 may be an LTE network or some other wireless network, such as a 5G or NR network. The wireless network 100 may include a number of BSs 110 (shown as BS 110a, BS 110b, BS 110c, and BS 110d) and other network entities. ABS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular area (e.g., a fixed or changing geographical area). In some scenarios, BSs 110 may be stationary or non-stationary. In some non-stationary scenarios, mobile BSs 110 may move with varying speeds, direction, and/or heights. In 3GPP, the term "cell" can refer to a coverage area of a BS 110 and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. Additionally, or alternatively, a BS may support access to an unlicensed RF band (e.g., a Wi-Fi band and/or the like). A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. ABS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces such as a direct physical connection, a virtual network, and/or the like using any suitable transport network. In other scenarios, BSs may be implemented in a software defined network (SDN) manner or via network function virtualization (NFV) manner.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, robotics, drones, implantable devices, augmented reality devices, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as may be implemented as NB-IoT (narrowband internet of things) devices. Some UEs may be considered a Customer Premises Equipment (CPE). UE 120 may be included inside a housing that houses components of UE 120, such as processor components, memory components, and/or the like. These components may be integrated in a variety of combinations and/or may be stand-alone, distributed components considering design constraints and/or operational preferences.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110. A UE performing scheduling operations can include or perform base-station-like functions in these deployment scenarios.

As indicated above, FIG. 1 is provided as an example. Other examples may differ from what is described with regard to FIG. 1.

Figure 2:
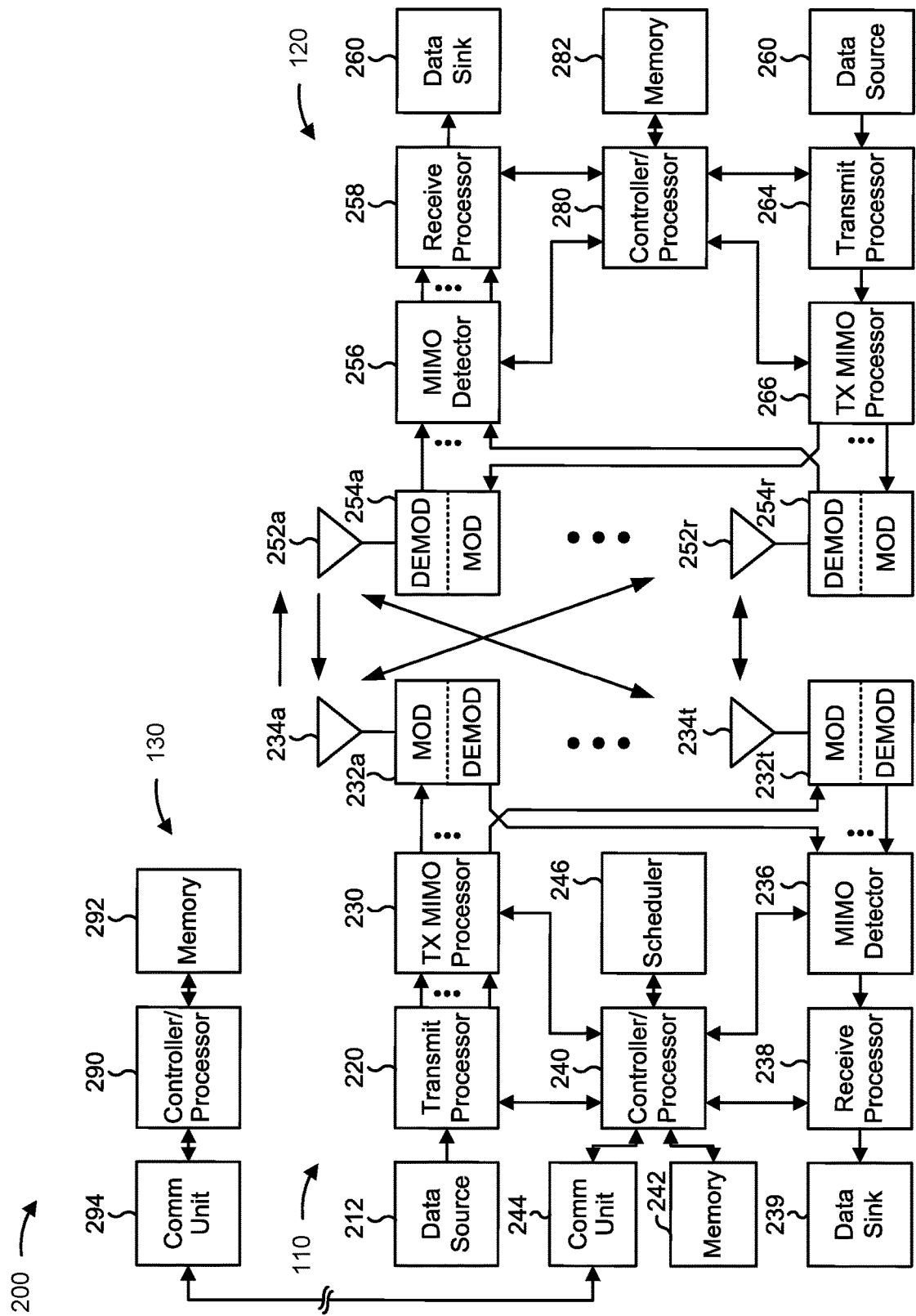
FIG. 2 is a block diagram illustrating an example of a base station in communication with a UE in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1. The T and R antennas may be configured with multiple antenna elements formed in an array for MIMO or massive MIMO deployments that can occur in millimeter wave (mmWave or mmW) communication systems.

At base station 110, a transmit processor 220 can carry out a number of functions associated with communications. For example, transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive downlink RF signals. The downlink RF signals may be received from and/or may be transmitted by one or more base stations 110. The signals can be provided to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

For uplink communications, a UE 120 may transmit control information and/or data to another device, such as one or more base stations 110. For example, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with adaptive phase-locked loop bandwidth control, as described in more detail elsewhere herein. For example, controller/processor 240 of base station 110, controller/processor 280 of UE 120, and/or any other component(s) of FIG. 2 may perform or direct operations of, for example, process 600 of FIG. 6 and/or other processes as described herein. Memories 242 and 282 may store data and program codes for base station 110 and UE 120, respectively. A scheduler 246 may schedule UEs for data transmission on the downlink and/or uplink.

In some aspects, the UE 120 may include a variety of means or components for implementing communication functions. For example, the variety of means may include means for determining at least one of an OFDM parameter associated with the apparatus or a modem function associated with a modem of the apparatus; means for controlling a loop bandwidth of a PLL, used to generate a tunable RF carrier frequency used by the UE 120 to communicate synchronously with a base station, based at least in part on at least one of the OFDM parameter or the modem function; and/or the like.

In some aspects, the UE 120 may include a variety of structural components for carrying out functions of the various means. For example, structural components that carry out functions of such means may include one or more components of UE 120 described in connection with FIG. 2, such as antenna 252, DEMOD 254, MOD 254, MIMO detector 256, receive processor 258, transmit processor 264, TX MIMO processor 266, controller/processor 280, and/or the like.

As indicated above, FIG. 2 is provided as an example. Other examples may differ from what is described with regard to FIG. 2.

Figure 3:
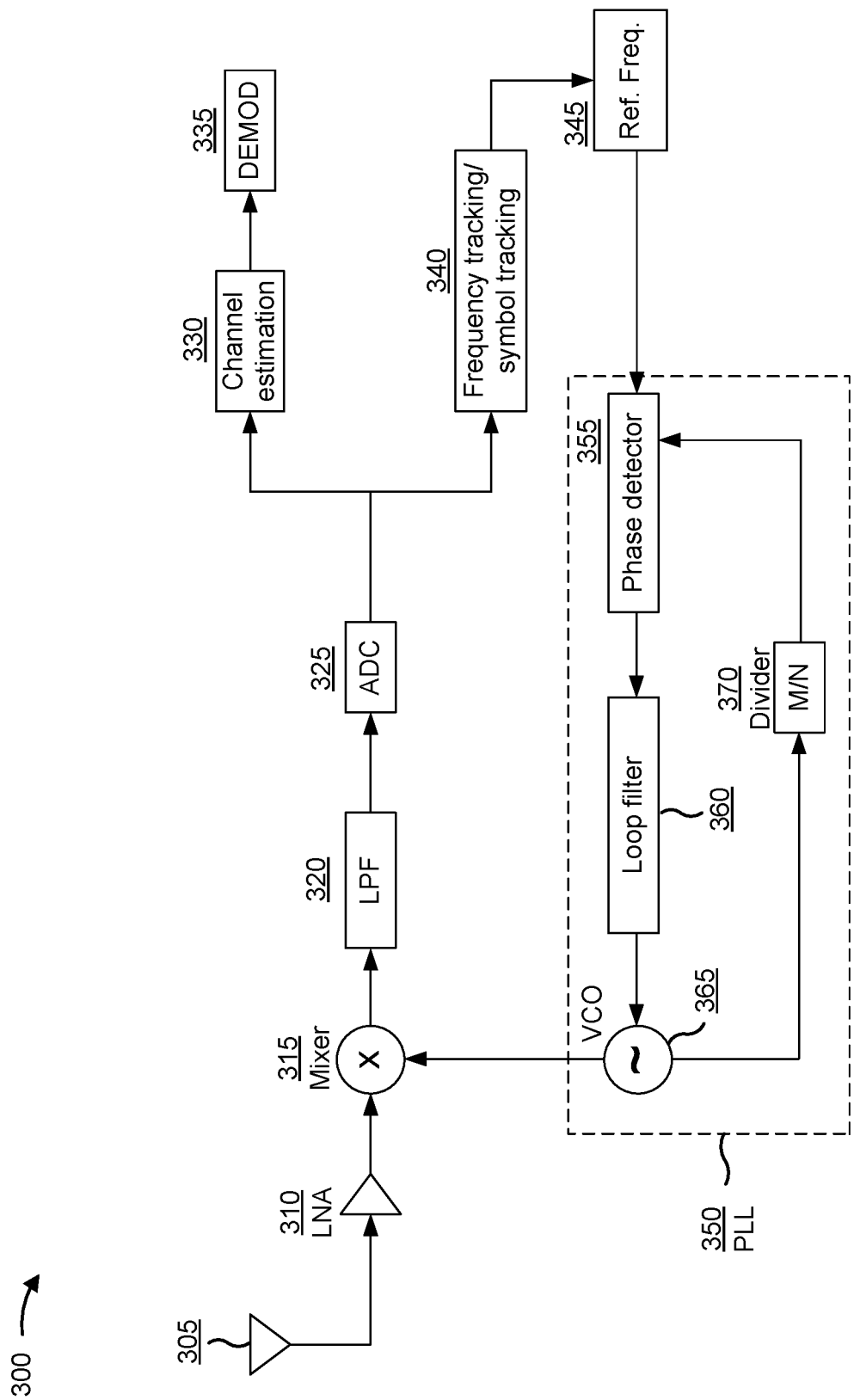
FIG. 3 is a block diagram illustrating an example of a phase-locked loop used to tune a UE operating frequency to a base station operating frequency, in accordance with various aspects of the present disclosure.

FIG. 3 is a block diagram illustrating an example 300 of a phase-locked loop configured and/or used for UE tuning. The tuning features enable a UE to tune its operating RF frequency to a base station operating frequency, in accordance with various aspects of the present disclosure. Example 300 shows components of a UE 120 or of another device for use in frequency tuning. As an example, the illustrated components can operate to tune an operating frequency of a UE 120. As one example, an operating frequency of a UE 120 can be tuned to an operating frequency of a base station 110 and/or another type of wireless access point. As another example, one or more components of FIG. 3 may be used to generate a tunable RF carrier frequency used by the UE 120 to communicate synchronously with a base station 110 (e.g., that is operating at a particular RF frequency).

As shown in FIG. 3, UE 120 may include one or more antennas 305, one or more low noise amplifiers (LNAs) 310, one or more mixers 315 (e.g., a frequency mixer, a multiplier, and/or the like), a low-pass filter (LPF) 320, an analog to digital converter (ADC) 325, a channel estimation component 330, a demodulator (DEMOD) 335, a frequency tracking and/or symbol tracking component 340 (sometimes referred to as a frequency/symbol tracking component), a reference frequency component 345, and a phase-locked loop (PLL) 350. As further shown, the PLL 350 may include a phase detector 355, a loop filter 360, a voltage-controlled oscillator (VCO) 365, and a fractional divider 370. The PLL 350 may be used to tune an operating frequency of the UE 120 to a desired frequency. In some aspects, for example, the PLL 350 can tune the an operating frequency of the UE 120 to an operating frequency of a base station 110 with which the UE 120 is communicating. By tuning to the operating frequency of the base station 110, the demodulation operations of the UE 120 may improve (e.g., via an increase in demodulation accuracy). In a particular example, the PLL 350 may be used to control the operating frequency of the UE 120 to match the operating frequency of the base station 110 (e.g., to generate a tunable RF carrier frequency used by the UE 120 to communicate synchronously with a base station 110 that is operating at a particular RF frequency).

The UE 120 may receive an analog signal (e.g., a wireless signal) from the base station 110 via the antenna 305, which may provide the analog signal to the LNA 310. The LNA 310 may amplify the signal (or some portion of the signal), and may provide an amplified signal to the mixer 315. The mixer 315 may mix the amplified signal (e.g., an RF signal received via the antenna 305) and a control signal. The control signal may be received from the VCO 365 and used to convert (e.g., downconvert) a frequency of the RF signal to another frequency so that further processing can be performed on the RF signal. The RF signal may be received at a first operating frequency used by a base station 110, and the control signal may be used to tune a second operating frequency of the UE 120 to the first operating frequency. The mixer 315 may provide the converted signal to the LPF 320. The LPF 320 may filter the signal and provide the filtered signal to the ADC 325. The ADC 325 may convert the filtered analog signal to a digital signal, and may provide the digital signal to the channel estimation component 330 and the frequency/symbol tracking component 340.

The channel estimation component 330 plays a role in estimating channel conditions for UE operations. As one example, the channel estimation component 330 may perform channel estimation on the digital signal, and may provide channel estimates to the demodulator 335. The demodulator 335 may demodulate the digital signal using the channel estimates to recover data carried in a modulated signal (e.g., the analog RF signal received by the antenna 305). The frequency/symbol tracking component 340 may detect a frequency error and/or a phase error in the digital signal, and may provide an indication of such error(s) to the reference frequency component 345. The reference frequency component 345 may control a reference frequency of a reference signal (e.g., a local oscillator signal) based at least in part on the error(s) to improve the accuracy of a control signal output from the PLL 350 (e.g., the VCO 365) to the mixer 315. The reference frequency component 345 may provide the reference signal to the PLL 350.

The PLL 350 may receive and utilize received reference signals in a variety of manners. For example, the phase detector 355 of the PLL 350 may receive the reference signal from the reference frequency component 345, may compute a phase error (difference) signal between the reference signal and the feedback signal of the PLL 350 (e.g., using a charge-pump phase-frequency detector (CP-PFD)), and may output the phase difference signal to the loop filter 360. The loop filter 360 may filter the signal received from the phase detector 355, and may use the filtered signal to control the VCO 365 (e.g., to control a voltage applied to the VCO 365).

The VCO 365 may be controlled to modify a control signal output from the VCO 365 to the mixer 315. For example, different voltages applied to the VCO 365 may result in different frequencies for the control signal output from the VCO 365 to the mixer 315. The VCO 365 may upconvert the reference signal to generate the control signal, and a degree of the up-conversion may depend on an input from the loop filter 360. The VCO 365 may also output the upconverted signal to the fractional divider 370, which may downconvert the signal and provide the downconverted signal to the phase detector 355 as a feedback signal. The phase detector 355 may compute a phase error (or difference) signal from the feedback signal and the reference signal generated by the reference frequency component 345.

In some scenarios, the PLL 350 may add phase noise to the reference frequency. Addition of phase noise may generally reduce demodulation accuracy (e.g., decrease the signal-to-noise ratio of the demodulated signal). Phase noise may contribute to both constant phase error (CPE) and inter-carrier interference (ICI). Both CPE and ICI can reduce demodulation accuracy.

Yet CPE and ICI can have different effects on demodulation, as described in more detail below in connection with FIG. 4. In some conditions (e.g., for some OFDM parameters and/or modem functions), CPE may have a relatively greater impact on the accuracy of demodulation than ICI. In other conditions, ICI may have a relatively greater impact on the accuracy of demodulation than CPE. Some techniques and apparatuses described herein improve demodulation performance by accounting for these conditions when mitigating CPE and ICI.

As indicated above, FIG. 3 is provided as an example. Other examples may differ from what is described with regard to FIG. 3.

Figure 4:
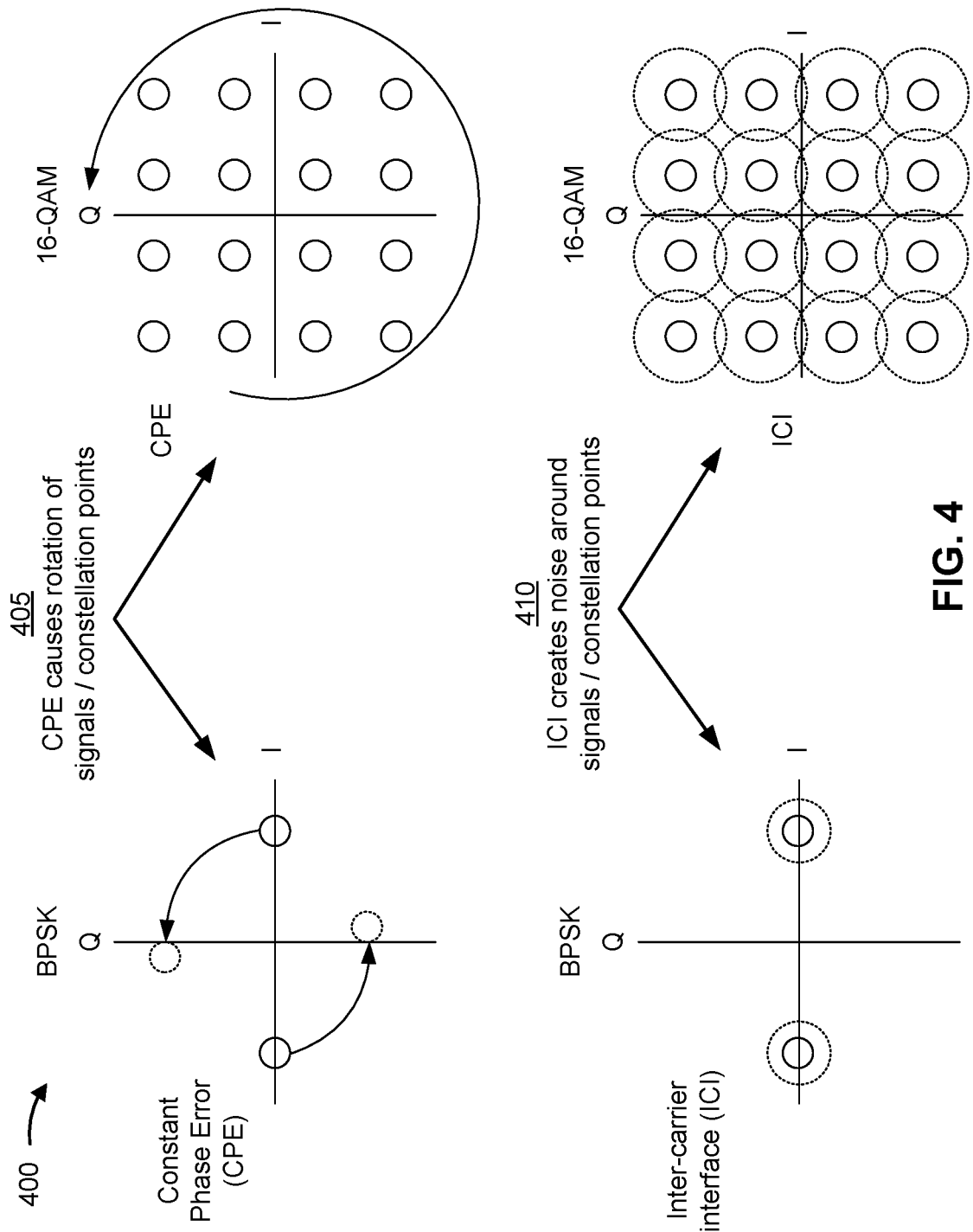
FIG. 4 is a diagram illustrating an example of constant phase error and inter-carrier interference for different modulation and coding schemes, in accordance with various aspects of the present disclosure.

FIG. 4 is a diagram illustrating an example 400 of constant phase error and inter-carrier interference for different modulation and coding schemes, in accordance with various aspects of the present disclosure.

FIG. 4 shows the impact of constant phase error (CPE) and inter-carrier interference (ICI) on a constellation diagram used to demodulate signals. A constellation diagram is a representation of a signal modulated by a digital modulation scheme, such as binary phase shift keying (BPSK), π/2 BPSK, quadrature phase shift keying (QPSK), quadrature amplitude modulation (QAM) (such as 16-QAM, 64-QAM, 128-QAM, 256-QAM, or the like), and/or the like. A constellation diagram illustrates a signal as a two-dimensional scatter diagram with an x axis (e.g., a horizontal real axis representing an in-phase carrier, shown as an I component) and a y axis (e.g., a vertical imaginary axis representing a quadrature carrier, shown as a Q component). The angle of a constellation point, measured counterclockwise from the horizontal axis, represents a phase shift of a carrier wave from a reference phase. The distance to a constellation point, measured from the origin, represents the amplitude or power of the signal.

In a digital modulation system, information is transmitted as a series of samples, each occupying a uniform time slot. During each sample, the carrier wave has a constant amplitude and phase that is restricted to one of a finite number of values, so each sample encodes one of a finite number of symbols, which in turn represent one or more binary digits (bits) of information. Each symbol is encoded as a different combination of amplitude and phase of the carrier, so each symbol is represented by a point on the constellation diagram, called a constellation point. The constellation diagram shows all the possible symbols that can be transmitted by the system as a collection of points.

During demodulation, a demodulator identifies a constellation point with a highest likelihood of corresponding to a received signal (e.g., a received sample). Under good channel conditions, the received signal experiences a small amount of noise and/or interference, and thus the demodulator is more likely to identify a constellation point that correctly corresponds to the received signal. However, when the received signal is subject to a higher amount of noise and/or interference, the demodulator is more likely to incorrectly identify a constellation point from the signal, resulting in inaccurate demodulation and incorrect bit determination.

As shown by reference number 405, constant phase error (CPE) is a type of phase noise that causes a rotation of a signal, around the origin, from a constellation point that corresponds to the signal. As further shown, different modulation and coding schemes (MCSs) may have different degrees of robustness against CPE as compared to ICI. For example, BPSK may be less robust against CPE (e.g., as compared to ICI) because a rotation by 90 degrees or more may cause the received signal to be mapped to an incorrect constellation point. As another example, 16-QAM may be more robust against CPE (e.g., as compared to ICI).

As shown by reference number 410, ICI is a type of phase noise that creates noise (e.g., a random cloud of noise) around each constellation point. As further shown, different MCSs may have different degrees of robustness against ICI as compared to CPE. For example, BPSK may be more robust against ICI (e.g., as compared to CPE) because the constellation points are far apart, and thus a cloud of noise around a constellation point is less likely to cause incorrect constellation point identification as compared to CPE. As another example, 16-QAM may be less robust against ICI (e.g., as compared to CPE) because the constellation points are closer together, and thus a cloud of noise around each constellation point is more likely to lead to misidentification of an adjacent constellation point as compared to CPE.

Thus, in some conditions (such as some MCSs), CPE may have a bigger impact on the accuracy of demodulation than ICI, and in other conditions (such as other MCSs) ICI may have a bigger impact on the accuracy of demodulation than CPE. These conditions are provided as examples, and other conditions may cause varying impacts of CPE and ICI on demodulation performance, as described in more detail in connection with FIG. 5. Some techniques and apparatuses described herein improve demodulation performance by accounting for these conditions when mitigating CPE and ICI.

As indicated above, FIG. 4 is provided as an example. Other examples may differ from what is described with regard to FIG. 4.

Figure 5:
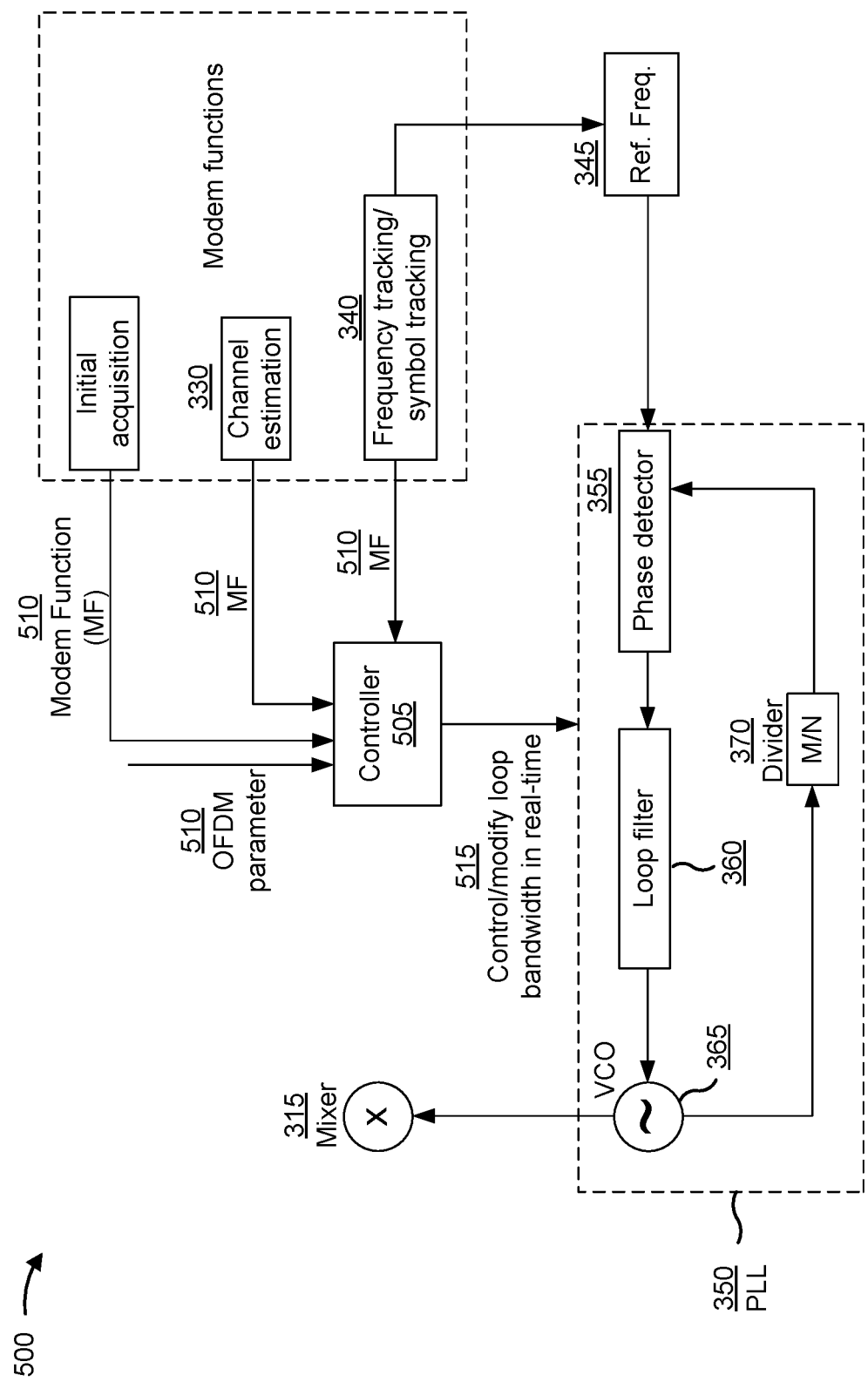
FIG. 5 is a diagram illustrating an example of adaptive phase-locked loop bandwidth control, in accordance with various aspects of the present disclosure.

FIG. 5 is a diagram illustrating an example 500 of adaptive phase-locked loop bandwidth control, in accordance with various aspects of the present disclosure.

As shown in FIG. 5, a UE 120 may include a controller 505 (e.g., one or more controllers and/or one or more processors). In some aspects, the controller 505 may correspond to the controller/processor 280 of FIG. 2. Additionally, or alternatively, one or more functions of the controller 505 may be performed by the channel estimation component 330, the frequency/symbol tracking component 340, and/or the like.

As shown by reference number 510, the controller 505 may determine an OFDM parameter associated with (e.g., to be used by) the UE 120 and/or a modem function (e.g., a baseband modem function) associated with (e.g., to be performed by) a modem of the UE 120. In some aspects, the controller 505 may receive an indication of the OFDM parameter and/or the modem function. As shown in FIG. 5, the controller 505 may receive such information from the channel estimation component 330, the frequency/symbol tracking component 340, and/or from another component of the UE 120. As described in more detail below, the OFDM parameter may include an MCS of a receive signal, an OFDM symbol type, whether the OFDM symbol is received on a data channel or a control channel, a sub-carrier spacing, a symbol frequency, a parameter associated with a phase tracking reference signal (PTRS), and/or the like. As also described in more detail below, the modem function may include initial network acquisition (or a function other than initial network acquisition), a channel estimation function (e.g., a periodicity of channel estimation), and/or the like.

As shown by reference number 515, the controller 505 may control a loop bandwidth of the PLL 350 in real-time. As used herein, controlling the loop bandwidth in real-time generally refers to timing associated with controller 505 and/or PLL 350 operations. In some scenarios, real-time operations may refer to controlling the loop bandwidth during operation of the UE 120; controlling the loop bandwidth while signals are being received, processed (e.g., by one or more components of FIG. 3 and/or FIG. 5), and/or demodulated by the UE 120; controlling the loop bandwidth during operation of the PLL 350 (e.g., while the PLL 350 is tuning an operating frequency of the UE 120 to an operating frequency of the base station 110); and/or the like. In some situations, real-time operations may be referred to as runtime operations. The controller 505 may also receive additional or other input parameters at various times of operation for controlling the loop bandwidth of the PLL 350.

The controller 505 may control the loop bandwidth based at least in part on the OFDM parameter and/or the modem function. In some aspects, the controller 505 may control the loop bandwidth by modifying one or more parameters of the PLL 350 (e.g., one or more components of PLL 350, such as phase detector 355, loop filter 360, VCO 365, and/or the like), such as a gain parameter, a pole parameter, a zero parameter, a charge pump current, and/or the like. For example, the controller 505 may modify a gain, a pole, and/or a zero of the phase detector 355, the loop filter 360, and/or the VCO 365. By modifying one or more of these parameters, the controller 505 may modify a transfer function of the PLL 350 that defines an output signal (e.g., a control signal output from the VCO 365 to the mixer 315) generated from an input signal (e.g., a reference signal received from the reference frequency component 345). Furthermore, by controlling the loop bandwidth of the PLL 350, the controller 505 can control phase noise generated by the PLL 350 (e.g., by the VCO 365). For example, the controller 505 may control the phase noise to control a first portion of the phase noise that contributes to CPE and/or a second portion of the phase noise that contributes to ICI.

The controller 505 may also receive additional inputs related to UE operations. In some aspects, the controller 505 may control the loop bandwidth for a signal based at least in part on whether the UE 120 (e.g., a modem of the UE 120) is performing an initial network acquisition function in connection with the signal. Initial network acquisition may refer to searching for, receiving, and/or processing one or more reference signals transmitted by a base station 110 prior to performing a random access channel (RACH) procedure between the base station 110 and the UE 120. The one or more reference signals may include, for example, a primary synchronization signal (PSS), a secondary synchronization signal (SSS), a synchronization signal block (SSB), one or more signals of a physical broadcast channel (PBCH), an SSB/PBCH block, and/or the like.

PLL 350 configurations may include a range of operational features such that the controller 505 enables a wide degree of control. For example, the controller 505 may configure the PLL 350 to use a wider loop bandwidth when the modem is performing an initial network acquisition function (e.g., as compared to when the modem is not performing the initial network acquisition function), and may configure the PLL 350 to use a narrower loop bandwidth when the modem is not performing the initial network acquisition function (e.g., when the modem is acquiring data, such as via a data channel) as compared to when the modem is performing the initial network acquisition function. A wider loop bandwidth may mitigate CPE more than ICI, and a narrower loop bandwidth may mitigate ICI more than CPE. Because PSS and SSS use a BPSK MCS, CPE may have a bigger impact than ICI on demodulation performance when demodulating the PSS and/or the SSS. Thus, when the modem is performing initial network acquisition, the controller 505 may configure the PLL 350 to use a wider loop bandwidth to mitigate the larger effects of CPE for more accurate demodulation of the PSS and SSS. Furthermore, a wider loop bandwidth results in tuning or locking the UE frequency to the base station frequency more quickly than a narrower loop bandwidth, which may allow for faster initial network acquisition.

Additionally, or alternatively, the controller 505 may control the loop bandwidth for a signal based at least in part on an MCS used for the signal. In some aspects, the MCS for the signal may be indicated by the base station 110 in connection with the signal (e.g., in downlink control information (DCI) that schedules transmission of the signal) and/or may be used by the UE 120 to demodulate the signal. In some aspects, the MCS used for a signal may depend on an OFDM symbol type of the signal and/or a channel used for transmission of the signal. For example, a control channel (e.g., a physical downlink control channel (PDCCH)) may use a fixed OFDM symbol type having a specific MCS, such as QPSK, while a data channel (e.g., a physical downlink shared channel (PDSCH)) may use a variable OFDM symbol type having a variable MCS ranging from QPSK up to 256-QAM, for example. Thus, in some aspects, the controller 505 may control the loop bandwidth for a signal based at least in part on an OFDM symbol type of the signal, a channel via which the signal is received, and/or the like.

PLL 350 configurations may also consider a range of MCS settings. For example, the controller 505 may configure the PLL 350 to use a wider loop bandwidth for a signal having a first MCS (e.g., a lower MCS with fewer bits per symbol) as compared to a loop bandwidth used for a signal having a second MCS, and may configure the PLL 350 to use a narrower loop bandwidth for a signal having a second MCS (e.g., a higher MCS with more bits per symbol) as compared to a loop bandwidth used for a signal having the first MCS. As described above in connection with FIG. 4, a lower order MCS (e.g., BPSK, QPSK, and/or the like) may experience a greater impact from CPE as compared to ICI, while a higher order MCS (e.g., 16-QAM, 64-QAM, 256-QAM, and/or the like) may experience a greater impact from ICI as compared to CPE. Thus, a wider loop bandwidth may be used for increased mitigation of CPE for lower modulation orders, while a narrower loop bandwidth may be used for increased mitigation of ICI for higher modulation orders. In some aspects, the controller 505 may configure the PLL 350 to use a wider loop bandwidth for a first channel and/or a first OFDM symbol type that uses a lower order MCS (e.g., a PDCCH that uses QPSK) as compared to a loop bandwidth used for a second channel and/or a second OFDM symbol type, and may configure the PLL 350 to use a narrower loop bandwidth for a second channel and/or a second OFDM symbol type that uses a higher order MCS (e.g., a PDSCH that uses QPSK, 16-QAM, 64-QAM, 256-QAM, and/or the like) as compared to a loop bandwidth used for the first channel and/or the first OFDM symbol type.

Additionally, or alternatively, the controller 505 may control the loop bandwidth for a signal based at least in part on a sub-carrier spacing used for the signal. In some aspects, the sub-carrier spacing may be indicated to the UE 120 by the base station 110 (e.g., in a system information block (SIB), a RACH procedure, a radio resource control (RRC) configuration, and/or the like). In some aspects, a symbol duration for a signal may depend on the sub-carrier spacing for the signal. Thus, in some aspects, the controller 505 may control the loop bandwidth for a signal based at least in part on the symbol duration of the signal.

PLL 350 configurations may also consider a range of bandwidths used during operations. For example, the controller 505 may configure the PLL 350 to use a wider loop bandwidth for a signal having a first sub-carrier spacing (e.g., a higher sub-carrier spacing, such as 120 kHz, 240 kHz, and/or the like) as compared to a loop bandwidth used for a signal having a second sub-carrier spacing, and may configure the PLL 350 to use a narrower loop bandwidth for a signal having a second sub-carrier spacing (e.g., a lower sub-carrier spacing, such as 30 kHz, 60 kHz, and/or the like) as compared to a loop bandwidth used for a signal having the first sub-carrier spacing. Using a higher sub-carrier spacing may mitigate the impact of ICI. Thus, the controller 505 may control the loop bandwidth to focus on offsetting CPE for a higher sub-carrier spacing, and/or may control the loop bandwidth to focus on offsetting ICI for a lower sub-carrier spacing.

Additionally, or alternatively, the controller 505 may control the loop bandwidth for a signal based at least in part on a periodicity of channel estimation performed by the UE 120 (e.g., how often the UE 120 performs channel estimation). In some aspects, the periodicity of channel estimation may be indicated to the controller 505 by the channel estimation component 330. In some aspects, the periodicity of channel estimation may depend on a demodulation reference signal (DMRS) periodicity and/or a number of DMRSs transmitted per symbol (e.g., up to four DMRS symbols per slot), which may be indicated in a configuration from the base station 110 to the UE 120. Thus, in some aspects, the controller 505 may control the loop bandwidth for a signal based at least in part on the DMRS periodicity, the number of DMRSs transmitted per symbol, and/or the like.

For example, the controller 505 may configure the PLL 350 to use a wider loop bandwidth when the modem is performing channel estimation less often (e.g., a larger periodicity of channel estimation) as compared to a loop bandwidth used when the modem is performing channel estimation more often, and may configure the PLL 350 to use a narrower loop bandwidth when the modem is performing channel estimation more often (e.g., a smaller periodicity of channel estimation) as compared to a loop bandwidth used when the modem is performing channel estimation less often. Channel estimation may be used to mitigate the impact of ICI. Thus, the controller 505 may control the loop bandwidth to focus on offsetting CPE when channel estimation is performed more often, and/or may control the loop bandwidth to focus on offsetting ICI when channel estimation is performed less often.

Additionally, or alternatively, the controller 505 may control the loop bandwidth for a signal based at least in part on a phase tracking reference signal (PTRS) configuration, such as a presence of PTRS, an absence of PTRS, a periodicity of PTRS, and/or the like. A PTRS is designed to mitigate and/or cancel the impact of CPE. Thus, in some aspects, when PTRSs are present and/or when PTRSs have a smaller periodicity (e.g., occur more frequently), then the controller 505 may configure a wider loop bandwidth to focus on mitigating ICI (which is not mitigated by PTRS) as compared to a loop bandwidth used when PTRSs are absent and/or when PTRSs have a larger periodicity. Additionally, or alternatively, when PTRSs are absent and/or when PTRSs have a larger periodicity (e.g., occur less frequently), then the controller 505 may configure a narrower loop bandwidth to focus on mitigating CPE (because the PTRS is either absent or occurs less frequently, resulting in less mitigation of CPE due to the PTRS) as compared to a loop bandwidth used when PTRSs are present and/or when PTRSs have a smaller periodicity.

PTRS can mitigate CPE impact. Yet certain designs may not have fully considered and/or understood phase noise impact on CPE and ICI. PTRS is a relatively complex process requiring large resource consumption by the UE 120. This includes consumption of processing resources, memory resources, battery power, and/or the like. Some techniques and apparatuses described herein may be used to mitigate CPE without using PTRS (e.g., by controlling a loop bandwidth of the PLL 350). Thus, in some aspects, the UE 120 may be configured to refrain from using the PTRS (e.g., to cancel CPE) when the loop bandwidth control techniques described herein are enabled. In this way, resources of the UE 120 may be conserved.

Additionally, or alternatively, the UE 120 may signal a capability regarding loop bandwidth control to the base station 110. If the UE 120 has such a capability, then the base station 110 may disable transmission of PTRS for that UE 120, thereby conserving network resources (e.g., time resources, frequency resources, and/or the like) that would otherwise be used to transmit the PTRS, and conserving base station resources (e.g., processing resources, memory resources, battery power, and/or the like) that would otherwise be used to generate and transmit the PTRS.

As indicated above, FIG. 5 is provided as an example. Other examples may differ from what is described with regard to FIG. 5.

Figure 6:
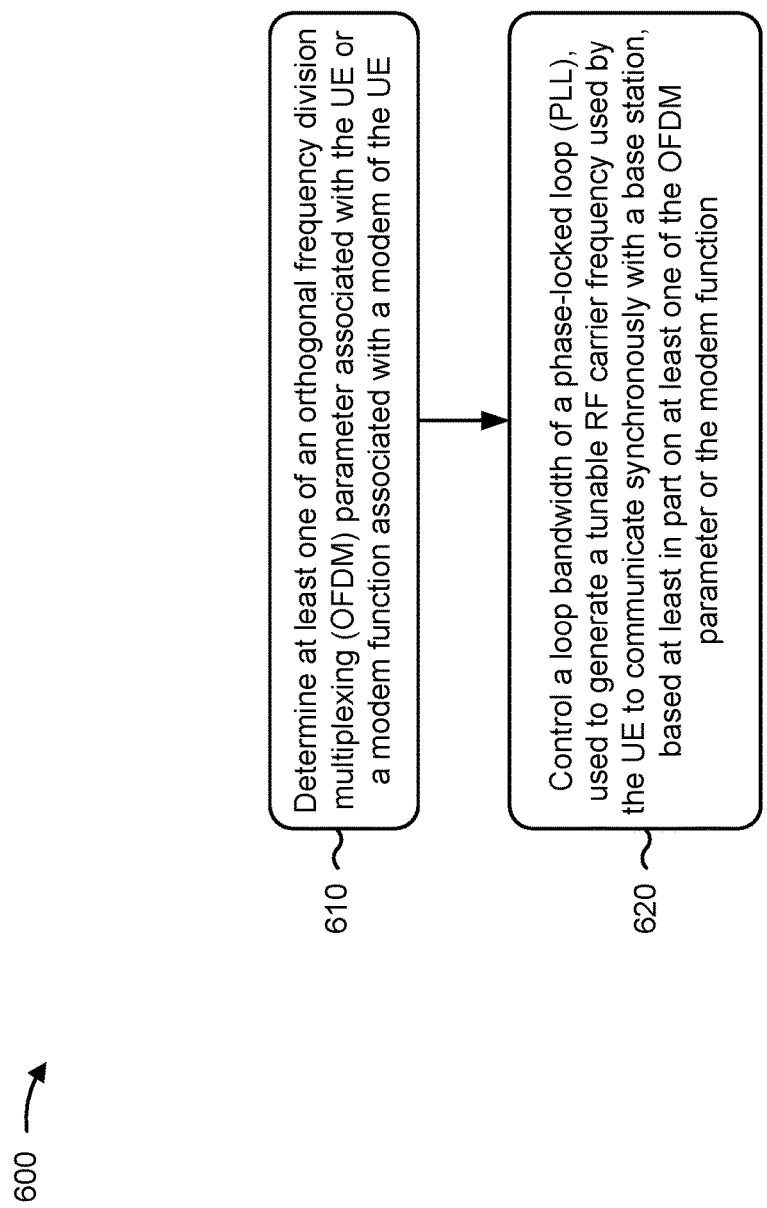
FIG. 6 is a diagram illustrating an example process performed, for example, by a user equipment, in accordance with various aspects of the present disclosure.

FIG. 6 is a diagram illustrating an example process 600 performed, for example, by a UE, in accordance with various aspects of the present disclosure. Example process 600 is an example where a UE (e.g., UE 120 and/or the like) performs operations associated with adaptive phase-locked loop bandwidth control.

As shown in FIG. 6, in some aspects, process 600 may include determining at least one of an OFDM parameter associated with the UE or a modem function associated with a modem of the UE (block 610). For example, the UE (e.g., using controller 505, receive processor 258, controller/processor 280, memory 282, and/or the like) may determine at least one of an OFDM parameter associated with the UE or a modem function associated with a modem of the UE, as described above.

As further shown in FIG. 6, in some aspects, process 600 may include controlling a loop bandwidth of a PLL, used to generate a tunable RF carrier frequency used by the UE to communicate synchronously with a base station, based at least in part on at least one of the OFDM parameter or the modem function (block 620). For example, the UE (e.g., using controller 505, controller/processor 280, memory 282, and/or the like) may control a loop bandwidth of a PLL, used to generate a tunable RF carrier frequency used by the UE to communicate synchronously with a base station (e.g., that is operating at a particular RF frequency), based at least in part on at least one of the OFDM parameter or the modem function, as described above.

Process 600 may include additional aspects, such as any single aspect or any combination of aspects described below and/or in connection with one or more other processes described elsewhere herein.

In a first aspect, controlling the loop bandwidth comprises controlling a phase noise generated by the PLL.

In a second aspect, alone or in combination with the first aspect, controlling the loop bandwidth comprises at least one of: modifying a gain parameter of a component of the PLL, modifying a pole parameter of a component of the PLL, modifying a zero parameter of a component of the PLL, or a combination thereof.

In a third aspect, alone or in combination with one or more of the first and second aspects, the modem function is initial network acquisition.

In a fourth aspect, alone or in combination with one or more of the first through third aspects, the initial network acquisition comprises reception of at least one of a primary synchronization signal or a secondary synchronization signal.

In a fifth aspect, alone or in combination with one or more of the first through fourth aspects, controlling the loop bandwidth comprises using a wider loop bandwidth based at least in part on a determination that the modem function is initial network acquisition, or using a narrower loop bandwidth based at least in part on a determination that the modem function is not initial network acquisition.

In a sixth aspect, alone or in combination with one or more of the first through fifth aspects, the OFDM parameter is a modulation and coding scheme.

In a seventh aspect, alone or in combination with one or more of the first through sixth aspects, the modulation and coding scheme is based at least in part on an OFDM symbol type used for communications between the UE and the base station.

In an eighth aspect, alone or in combination with one or more of the first through seventh aspects, controlling the loop bandwidth comprises using a wider loop bandwidth based at least in part on a determination that the OFDM parameter is a lower modulation and coding scheme, or using a narrower loop bandwidth based at least in part on a determination that the OFDM parameter is a higher modulation and coding scheme.

In a ninth aspect, alone or in combination with one or more of the first through eighth aspects, controlling the loop bandwidth comprises using a wider loop bandwidth based at least in part on a determination that the UE is communicating using a control OFDM symbol type, or using a narrower loop bandwidth based at least in part on a determination that the UE is communicating using a data OFDM symbol type.

In a tenth aspect, alone or in combination with one or more of the first through ninth aspects, the OFDM parameter is a symbol duration or a sub-carrier spacing.

In an eleventh aspect, alone or in combination with one or more of the first through tenth aspects, controlling the loop bandwidth comprises using a wider loop bandwidth based at least in part on a determination that the OFDM parameter is a higher sub-carrier spacing, or using a narrower loop bandwidth based at least in part on a determination that the OFDM parameter is a lower sub-carrier spacing.

In a twelfth aspect, alone or in combination with one or more of the first through eleventh aspects, the modem function is a periodicity of channel estimation performed by the UE.

In a thirteenth aspect, alone or in combination with one or more of the first through twelfth aspects, controlling the loop bandwidth comprises using a wider loop bandwidth based at least in part on a determination that the modem function is a larger periodicity of channel estimation, or using a narrower loop bandwidth based at least in part on a determination that the modem function is a smaller periodicity of channel estimation.

In a fourteenth aspect, alone or in combination with one or more of the first through thirteenth aspects, the OFDM parameter is a presence or absence of a phase tracking reference signal (PTRS) or a periodicity of PTRS transmission.

In a fifteenth aspect, alone or in combination with one or more of the first through fourteenth aspects, process 600 includes refraining from using a phase tracking reference signal to cancel constant phase error based at least in part on controlling the loop bandwidth.

In a sixteenth aspect, alone or in combination with one or more of the first through fifteenth aspects, controlling the loop bandwidth comprises using a wider loop bandwidth based at least in part on a determination that a phase tracking reference signal (PTRS) is absent or has a larger periodicity, or using a narrower loop bandwidth based at least in part on a determination that the PTRS is present or has a smaller periodicity.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a user equipment (UE), comprising:

determining at least one of an orthogonal frequency division multiplexing (OFDM) parameter associated with the UE or a modem function associated with a modem of the UE,
 the OFDM parameter comprising at least one of:
  a presence or absence of a phase tracking reference signal (PTRS),
  a periodicity of PTRS transmission,
  a modulation and coding scheme based at least in part on an OFDM symbol type used for communications between the UE and a base station,
  a symbol duration, or
  a sub-carrier spacing; and
 controlling a loop bandwidth of an analog phase-locked loop (PLL), used to generate a tunable radio frequency (RF) carrier frequency used by the UE to communicate synchronously with the base station, based at least in part on at least one of the OFDM parameter or the modem function.

2. The method of claim 1, wherein controlling the loop bandwidth comprises controlling a phase noise generated by the analog PLL.

3. The method of claim 1, wherein controlling the loop bandwidth comprises at least one of:
 modifying a gain parameter of a component of the analog PLL,
 modifying a pole parameter of a component of the analog PLL,
 modifying a zero parameter of a component of the analog PLL, or
 a combination thereof.

4. The method of claim 1, wherein the modem function comprises initial network acquisition.

5. The method of claim 4, wherein the initial network acquisition comprises reception of at least one of a primary synchronization signal or a secondary synchronization signal.

6. The method of claim 1, wherein controlling the loop bandwidth comprises using a wider loop bandwidth based at least in part on a determination that the modem function is initial network acquisition, or using a narrower loop bandwidth based at least in part on a determination that the modem function is not initial network acquisition.

7. The method of claim 1, wherein the OFDM parameter comprises the modulation and coding scheme based at least in part on an OFDM symbol type used for communications between the UE and the base station.

8. The method of claim 1, wherein controlling the loop bandwidth comprises using a wider loop bandwidth based at least in part on a determination that the OFDM parameter is a lower modulation and coding scheme, or using a narrower loop bandwidth based at least in part on a determination that the OFDM parameter is a higher modulation and coding scheme.

9. The method of claim 1, wherein controlling the loop bandwidth comprises using a wider loop bandwidth based at least in part on a determination that the UE is communicating using a control OFDM symbol type, or using a narrower loop bandwidth based at least in part on a determination that the UE is communicating using a data OFDM symbol type.

10. The method of claim 1, wherein the OFDM parameter comprises the symbol duration or the sub-carrier spacing.

11. The method of claim 1, wherein controlling the loop bandwidth comprises using a wider loop bandwidth based at least in part on a determination that the OFDM parameter is a higher sub-carrier spacing, or using a narrower loop bandwidth based at least in part on a determination that the OFDM parameter is a lower sub-carrier spacing.

12. The method of claim 1, wherein the modem function comprises a periodicity of channel estimation performed by the UE.

13. The method of claim 1, wherein controlling the loop bandwidth comprises using a wider loop bandwidth based at least in part on a determination that the modem function is a larger periodicity of channel estimation, or using a narrower loop bandwidth based at least in part on a determination that the modem function is a smaller periodicity of channel estimation.

14. The method of claim 1, wherein the OFDM parameter comprises the presence or absence of the PTRS or the periodicity of PTRS transmission.

15. The method of claim 1, further comprising refraining from using a phase tracking reference signal to cancel constant phase error based at least in part on controlling the loop bandwidth.

16. The method of claim 1, wherein controlling the loop bandwidth comprises using a wider loop bandwidth based at least in part on a determination that a phase tracking reference signal (PTRS) is absent or has a larger periodicity, or using a narrower loop bandwidth based at least in part on a determination that the PTRS is present or has a smaller periodicity.

17. A user equipment (UE) for wireless communication, comprising:
 a memory; and
 one or more processors operatively coupled to the memory, the memory and the one or more processors configured to:
  determine at least one of an orthogonal frequency division multiplexing (OFDM) parameter associated with the UE or a modem function associated with a modem of the UE,
  the OFDM parameter comprising at least one of:
   a presence or absence of a phase tracking reference signal (PTRS),
   a periodicity of PTRS transmission,
   a modulation and coding scheme based at least in part on an OFDM symbol type used for communications between the UE and a base station,
   a symbol duration, or
   a sub-carrier spacing; and
  control a loop bandwidth of an analog phase-locked loop (PLL), used to generate a tunable radio frequency (RF) carrier frequency used by the UE to communicate synchronously with the base station, based at least in part on at least one of the OFDM parameter or the modem function.

18. The UE of claim 17, wherein the one or more processors, when controlling the loop bandwidth, are configured to control a phase noise generated by the PLL.

19. The UE of claim 17, wherein the one or more processors, when controlling the loop bandwidth, are configured to modify at least one of:
 a gain parameter of a component of the analog PLL,
 a pole parameter of a component of the analog PLL,
 a zero parameter of a component of the analog PLL, or
 a combination thereof.

20. The UE of claim 17, wherein the one or more processors, when controlling the loop bandwidth, are configured to configure a wider loop bandwidth based at least in part on a determination that the modem function is initial network acquisition, or configure a narrower loop bandwidth based at least in part on a determination that the modem function is not initial network acquisition.

21. The UE of claim 17, wherein the one or more processors, when controlling the loop bandwidth, are configured to configure a wider loop bandwidth based at least in part on a determination that the OFDM parameter is a lower modulation and coding scheme, or configure a narrower loop bandwidth based at least in part on a determination that the OFDM parameter is a higher modulation and coding scheme.

22. The UE of claim 17, wherein the one or more processors, when controlling the loop bandwidth, are configured to configure a wider loop bandwidth based at least in part on a determination that the UE is communicating using a control OFDM symbol type, or configure a narrower loop bandwidth based at least in part on a determination that the UE is communicating using a data OFDM symbol type.

23. The UE of claim 17, wherein the one or more processors, when controlling the loop bandwidth, are configured to configure a wider loop bandwidth based at least in part on a determination that the OFDM parameter is a higher sub-carrier spacing, or configure a narrower loop bandwidth based at least in part on a determination that the OFDM parameter is a lower sub-carrier spacing.

24. The UE of claim 17, wherein the one or more processors, when controlling the loop bandwidth, are configured to configure a wider loop bandwidth based at least in part on a determination that the modem function is a larger periodicity of channel estimation, or configure a narrower loop bandwidth based at least in part on a determination that the modem function is a smaller periodicity of channel estimation.

25. The UE of claim 17, wherein the OFDM parameter is the presence or absence of the PTRS or the periodicity of PTRS transmission.

26. The UE of claim 17, wherein the UE is further configured to refrain from using a phase tracking reference signal to cancel constant phase error based at least in part on controlling the loop bandwidth.

27. The UE of claim 17, wherein the one or more processors, when controlling the loop bandwidth, are configured to configure a wider loop bandwidth based at least in part on a determination that a phase tracking reference signal (PTRS) is absent or has a larger periodicity, or configure a narrower loop bandwidth based at least in part on a determination that the PTRS is present or has a smaller periodicity.

28. A non-transitory computer-readable medium storing one or more instructions for wireless communication, the one or more instructions comprising:
  one or more instructions that, when executed by one or more processors of a user equipment (UE), cause the one or more processors to:
    determine at least one of an orthogonal frequency division multiplexing (OFDM) parameter associated with the UE or a modem function associated with a modem of the UE,
      the OFDM parameter comprising at least one of:
        a presence or absence of a phase tracking reference signal (PTRS),
        a periodicity of PTRS transmission,
        a modulation and coding scheme based at least in part on an OFDM symbol type used for communications between the UE and a base station,
        a symbol duration, or
        a sub-carrier spacing; and
    control a loop bandwidth of an analog phase-locked loop (PLL), used to generate a tunable radio frequency (RF) carrier frequency used by the UE to communicate synchronously with the base station, based at least in part on at least one of the OFDM parameter or the modem function.

29. An apparatus for wireless communication, comprising:
  means for determining at least one of an orthogonal frequency division multiplexing (OFDM) parameter associated with the apparatus or a modem function associated with a modem of the apparatus,
    the OFDM parameter comprising at least one of:
      a presence or absence of a phase tracking reference signal (PTRS),
      a periodicity of PTRS transmission,
      a modulation and coding scheme based at least in part on an OFDM symbol type used for communications between the apparatus and a base station,
      a symbol duration, or
      a sub-carrier spacing; and
  means for controlling a loop bandwidth of an analog phase-locked loop (PLL), used to generate a tunable radio frequency (RF) carrier frequency used by the apparatus to communicate synchronously with the base station, based at least in part on at least one of the OFDM parameter or the modem function.

30. The UE of claim 17, wherein the OFDM parameter comprises the symbol duration or the sub-carrier spacing.

* * * * *